US012688974B2

(12) United States Patent
Wen et al.

(10) Patent No.: US 12,688,974 B2
(45) Date of Patent: Jul. 21, 2026

(54) CAPACITOR STRUCTURE AND SEMICONDUCTOR DEVICE

(71) Applicant: MEDIATEK INC., Hsinchu City (TW)

(72) Inventors: Je-Min Wen, Hsinchu City (TW);
Cheng-Hua Lin, Hsinchu City (TW);
Ching-Han Jan, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 515 days.

(21) Appl. No.: 18/055,128

(22) Filed: Nov. 14, 2022

(65) Prior Publication Data

US 2023/0187144 A1       Jun. 15, 2023

Related U.S. Application Data

(60) Provisional application No. 63/289,255, filed on Dec. 14, 2021.

(51) Int. Cl.
| | |
|---|---|
| *H01G 4/38* | (2006.01) |
| *H01G 4/01* | (2006.01) |
| *H01G 4/018* | (2006.01) |
| *H10D 1/68* | (2025.01) |

(52) U.S. Cl.
CPC ............... *H01G 4/38* (2013.01); *H01G 4/01* (2013.01); *H01G 4/018* (2013.01); *H10D 1/692* (2025.01)

(58) Field of Classification Search
CPC  H01G 4/018; H01G 4/01; H01G 4/38; H10D 1/692
See application file for complete search history.

(56) References Cited

U.S. PATENT DOCUMENTS

| | | | | | |
|---|---|---|---|---|---|
| 6,819,542 | B2 * | 11/2004 | Tsai | .................... | H01L 23/5223 |
| | | | | | 361/306.3 |
| 7,485,912 | B2 | 2/2009 | Wang | | |
| 2006/0180895 | A1 * | 8/2006 | Chen | ................... | H01L 23/5223 |
| | | | | | 257/595 |

(Continued)

FOREIGN PATENT DOCUMENTS

| | | |
|---|---|---|
| CN | 1253661 A | 5/2000 |
| CN | 101047209 A | 10/2007 |
| CN | 101271893 A | 9/2008 |

OTHER PUBLICATIONS

Chinese language office action dated Jun. 28, 2023, issued in application No. TW 111147979.

*Primary Examiner* — David M Sinclair
(74) *Attorney, Agent, or Firm* — McClure, Qualey & Rodack, LLP

(57) ABSTRACT

A capacitor structure includes a first comb-shaped electrode, a second comb-shaped electrode, a bottom electrode, an insulator layer, and a top electrode. The first comb-shaped electrode has a first pad and first fingers connecting to the first pad. The second comb-shaped electrode has a second pad and second fingers connecting to the first pad, wherein one of the second fingers is disposed between two adjacent first fingers. The bottom electrode includes a first portion, a second portion and a third portion which are spaced apart, wherein the first portion and the third portion are electrically coupled to the first comb-shaped electrode and the second comb-shaped electrode, respectively. The insulator layer is disposed over the bottom electrode. The top electrode is disposed over the insulator layer.

16 Claims, 8 Drawing Sheets

(56)                    References Cited

U.S. PATENT DOCUMENTS

| | | | |
|---|---|---|---|
| 2007/0268653 A1* | 11/2007 | Kim ..................... | H10D 84/212 |
| | | | 257/E27.048 |
| 2008/0230820 A1* | 9/2008 | Maeda ................. | H10D 84/212 |
| | | | 257/E29.345 |
| 2010/0164067 A1* | 7/2010 | Sugisaki ............. | H01L 23/5223 |
| | | | 257/532 |
| 2011/0151803 A1* | 6/2011 | van der Heijden .......................... | |
| | | | H01L 23/5223 |
| | | | 455/73 |
| 2012/0151726 A1 | 6/2012 | Chung | |
| 2015/0084107 A1 | 3/2015 | Li | |
| 2020/0075582 A1* | 3/2020 | Lu ......................... | H10D 89/10 |

* cited by examiner

CAPACITOR STRUCTURE AND SEMICONDUCTOR DEVICE

CROSS REFERENCE TO RELATED APPLICATIONS

This application claims the benefit of U.S. Provisional Application No. 63/289,255 filed on Dec. 14, 2021, the entirety of which is incorporated by reference herein.

BACKGROUND OF THE INVENTION

Field of the Invention

The present invention is related to semiconductor technology, and in particular to a capacitor structure and a semiconductor device.

Description of the Related Art

Semiconductor devices are widely used in various electronic applications, such as personal computers, mobile phones, digital cameras, and other electronic equipment. As a result of the progress being made in the semiconductor industry, a smaller semiconductor device that takes up less space than the previous generation of semiconductor devices is required.

However, although existing semiconductor devices generally meet requirements, they have not been satisfactory in every respect. For example, while the size of electronic components such as transistors and resistors is getting smaller, capacitors still need to take up more space than other electronic components owing to their physical properties. This is unfavorable for the shrinkage of semiconductor devices. Therefore, further improvements to semiconductor devices are required.

BRIEF SUMMARY OF THE INVENTION

Capacitor structures and semiconductor devices are provided. An exemplary embodiment of a capacitor structure includes a first comb-shaped electrode, a second comb-shaped electrode, a bottom electrode, an insulator layer, and a top electrode. The first comb-shaped electrode has a first pad and a plurality of first fingers connecting to the first pad. The second comb-shaped electrode has a second pad and a plurality of second fingers connecting to the first pad, wherein one of the second fingers is disposed between two adjacent first fingers. The bottom electrode includes a first portion, a second portion and a third portion which are spaced apart, wherein the first portion and the third portion are electrically coupled to the first comb-shaped electrode and the second comb-shaped electrode, respectively. The insulator layer is disposed over the bottom electrode. The top electrode is disposed over the insulator layer.

An exemplary embodiment of a semiconductor device includes a substrate, a first capacitor structure, a dielectric material, and a second capacitor structure. The first capacitor structure is disposed over the substrate and includes a first comb-shaped electrode and a second comb-shaped electrode adjacent to the first comb-shaped electrode. The dielectric material is disposed over the first capacitor structure. The second capacitor structure is disposed over the dielectric material and includes a bottom electrode, an insulator layer, and a top electrode. The bottom electrode includes a first portion, a second portion, and a third portion which are spaced apart by the dielectric material, wherein the first portion and the third portion are electrically coupled to the first capacitor structure. The insulator layer is disposed over the bottom electrode. The top electrode is disposed over the insulator layer.

Another exemplary embodiment of a semiconductor device includes a substrate, a bottom electrode, an insulator layer, a top electrode, a dielectric material, a first comb-shaped electrode, and a second comb-shaped electrode. The bottom electrode is disposed over the substrate. The insulator layer is disposed over the bottom electrode. The top electrode is disposed over the insulator layer. The dielectric material covers the top electrode. The first comb-shaped electrode is disposed over the dielectric material and electrically coupled to the top electrode, wherein the first comb-shaped electrode has a first pad and a plurality of first fingers connecting to the first pad. The second comb-shaped electrode is disposed over the dielectric material and electrically coupled to the bottom electrode, wherein the second comb-shaped electrode has a second pad and a plurality of second fingers connecting to the second pad, wherein the dielectric material extends between the first fingers and the second fingers.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
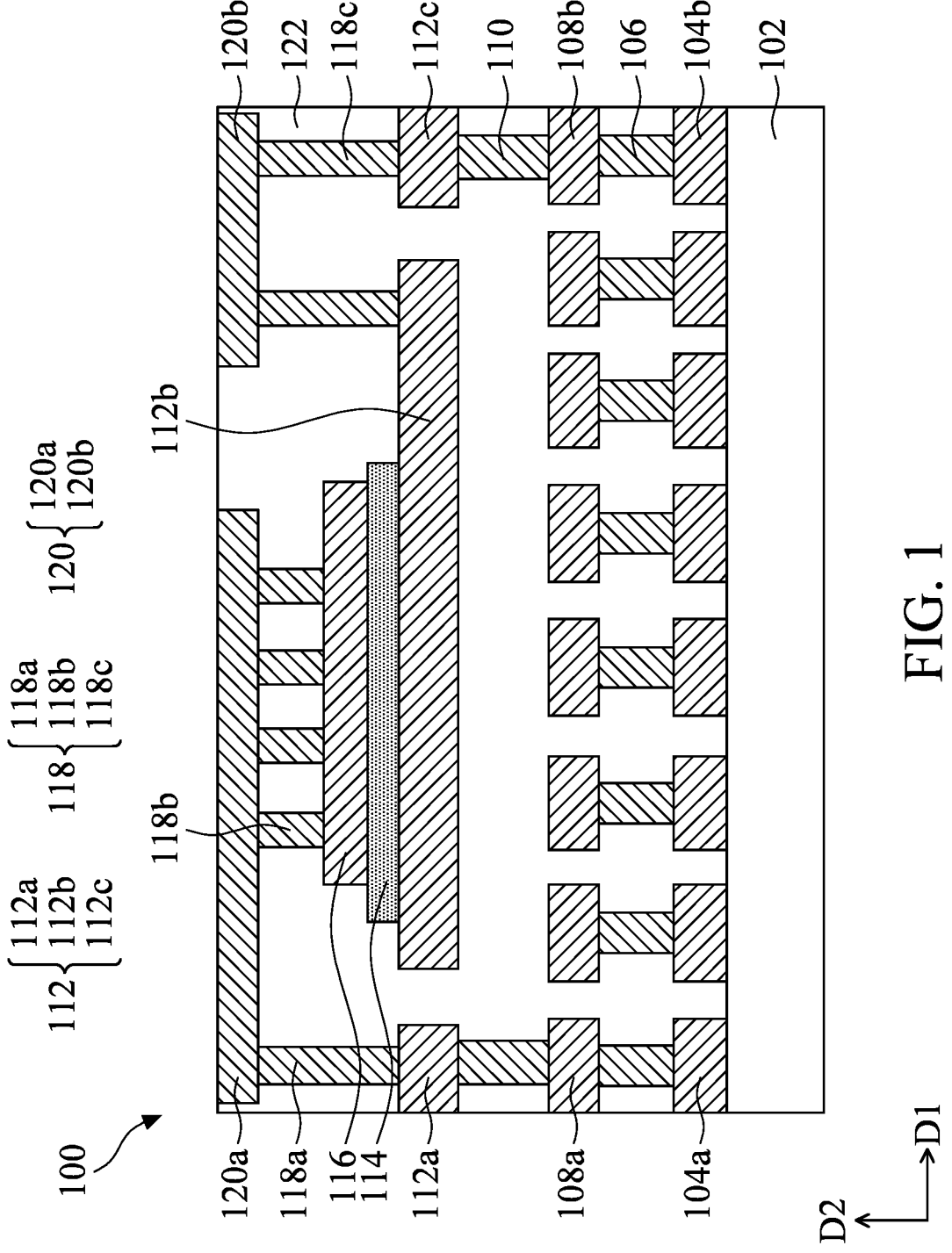
FIG. 1 is a cross-sectional view of an exemplary semiconductor device in accordance with some embodiments.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "forming a first element on/over a second element" may include embodiments in which the first element is in direct contact with the second element, and may also include embodiments in which additional elements are disposed between the first element and the second element such that the first element and the second element are not in direct contact.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A semiconductor device including a capacitor structure is described in accordance with some embodiments of the present disclosure. The capacitor structure may be formed of multiple capacitor structures which are stacked vertically. As a result, the capacitance can be increased without taking up larger design area.

FIG. 1 is a cross-sectional view of a semiconductor device 100 in accordance with some embodiments of the present disclosure. Additional features can be added to the semiconductor device 100. Some of the features described below can be replaced or eliminated for different embodiments. To simplify the diagram, only a portion of the semiconductor device 100 is illustrated.

As shown in FIG. 1, the semiconductor device 100 includes a substrate 102, in accordance with some embodiments. The substrate 102 may be a semiconductor substrate, and may be formed of any suitable semiconductor material, such as silicon, silicon germanium, or the like. The substrate 102 may include a bulk semiconductor or a composite substrate formed of different materials. The substrate 102 may include a semiconductor-on-insulator (SOI) substrate formed by a semiconductor material on an insulating layer. The substrate 102 may be doped (e.g., using p-type or n-type dopants) or undoped. Any desired semiconductor elements (including active elements and/or passive elements) may be formed in and on the substrate 102. However, in order to simplify the figures, only the flat substrate 102 is illustrated.

As illustrated in FIG. 1, the semiconductor device 100 includes a capacitor structure disposed over the substrate 102, in accordance with some embodiments. The capacitor structure can also be referred to as multiple capacitor structures depending on the position, such as at different levels. For example, the capacitor structure may be referred to as three capacitor structures at three levels, respectively. It should be noted that the configuration and number of the capacitor structure shown in the figures are exemplary only and are not intended to limit the present disclosure.

As shown in FIG. 1, the semiconductor device 100 includes a first comb-shaped electrode 104a and a second comb-shaped electrode 104b disposed over the substrate 102, in accordance with some embodiments. The first comb-shaped electrode 104a and the second comb-shaped electrode 104b may be alternatively arranged along a direction D1, which may be substantially parallel to a top surface of the substrate 102.

As illustrated in FIG. 1, the first comb-shaped electrode 104a and the second comb-shaped electrode 104b may be disposed at the same level, such as metal 1 (M1). The first comb-shaped electrode 104a and the second comb-shaped electrode 104b may be formed of the same or different conductive material, including copper, aluminum, titanium, tantalum, polysilicon, the like, or a combination thereof. The first comb-shaped electrode 104a and the second comb-shaped electrode 104b may be spaced apart by a dielectric material 122.

Figure 2:
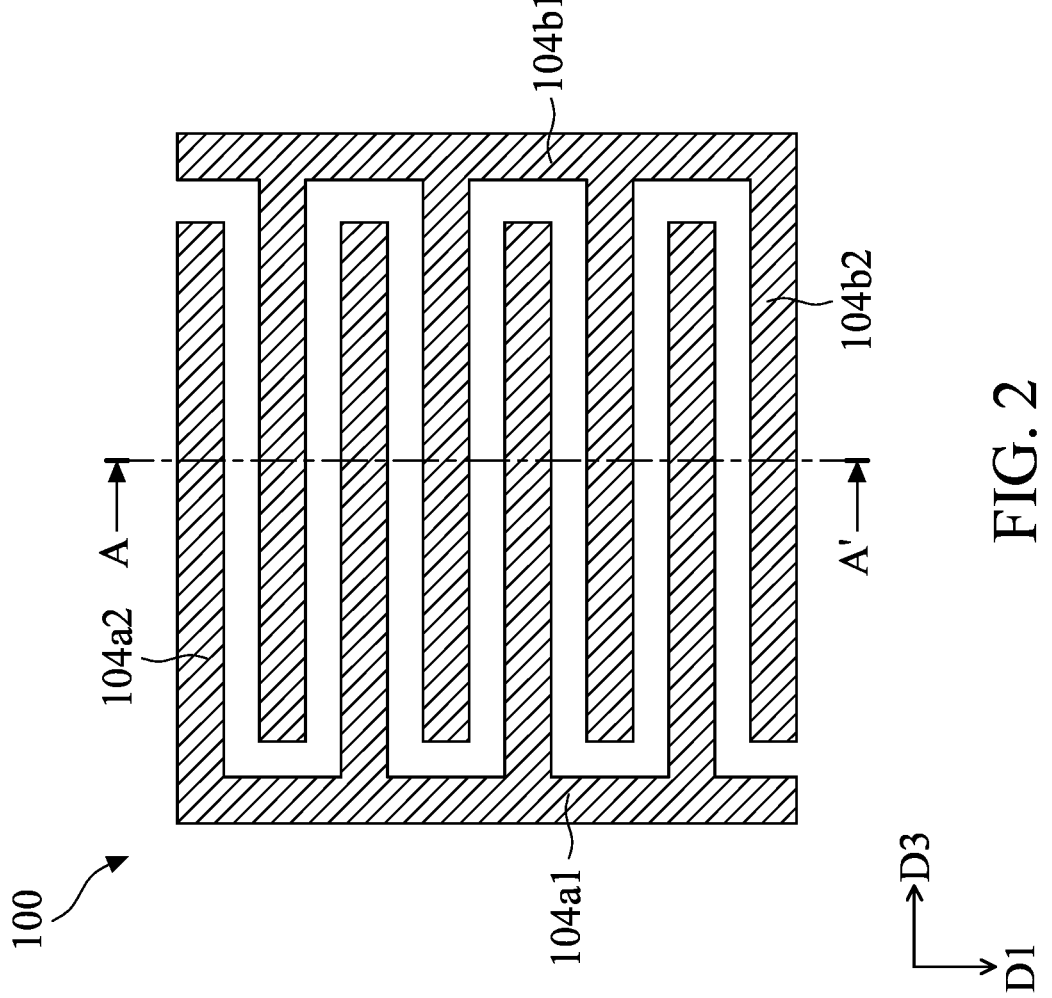
FIG. 2 is a top view of a portion of the exemplary semiconductor device of FIG. 1 in accordance with some embodiments.

In some embodiments, a first capacitor structure includes the first comb-shaped electrode 104a and the second comb-shaped electrode 104b. The first capacitor structure will be described with reference to FIG. 2. FIG. 2 is a top view of a portion of the semiconductor device 100 of FIG. 1, in accordance with some embodiments. FIG. 1 is a cross-sectional view of the semiconductor device 100 taken along line A-A' shown in FIG. 2.

As shown in FIG. 2, the first comb-shaped electrode 104a has a first pad 104a1 and a plurality of first fingers 104a2 connecting to the first pad 104a1, and the second comb-shaped electrode 104b has a second pad 104b1 and a plurality of second fingers 104b2 connecting to the second pad 104b1, in accordance with some embodiments. The first pad 104a1 and the second pad 104b1 may extend in the direction D1, and the first fingers 104a2 and the second fingers 104b2 may each extend in the direction D3, which is different from the direction D1. The direction D3 may be substantially vertical to the direction D1.

The first fingers 104a2 may be substantially parallel to each other, and the second fingers 104b2 may be substantially parallel to each other. The first fingers 104a2 may be substantially parallel to the second fingers 104b2, and the first pad 104a1 may be substantially parallel to the second pad 104b1. One of the second fingers 104b2 may be disposed between two adjacent first fingers 104a2.

Referring back to FIG. 1, the semiconductor device 100 includes a third comb-shaped electrode 108a and a fourth comb-shaped electrode 108b disposed over the first comb-shaped electrode 104a and the second comb-shaped electrode 104b, in accordance with some embodiments. The semiconductor device 100 may further include a plurality of conductive vias 106 therebetween. The conductive vias 106 may be formed of conductive material, including copper, aluminum, titanium, tantalum, polysilicon, the like, or a combination thereof.

The third comb-shaped electrode 108a and the fourth comb-shaped electrode 108b may be alternatively arranged along the direction D1, and the conductive vias 106 may each extend in a direction D2, which is different from the direction D1. The direction D2 may be substantially vertical to the direction D1.

As shown in FIG. 1, the positions of the third comb-shaped electrode 108a and the fourth comb-shaped electrode 108b may correspond to the positions of the first comb-shaped electrode 104a and the second comb-shaped electrode 104b. The third comb-shaped electrode 108a and the fourth comb-shaped electrode 108b may be electrically coupled to the first comb-shaped electrode 104a and the second comb-shaped electrode 104b through the conductive vias 106.

As illustrated in FIG. 1, the third comb-shaped electrode 108a and the fourth comb-shaped electrode 108b may be disposed at the same level, such as metal 2 (M2). The third comb-shaped electrode 108a and the fourth comb-shaped electrode 108b may be formed of the same or different conductive material, including copper, aluminum, titanium, tantalum, polysilicon, the like, or a combination thereof. The third comb-shaped electrode 108a and the fourth comb-shaped electrode 108b may be spaced apart by the dielectric material 122.

In some embodiments, a second capacitor structure includes the third comb-shaped electrode 108a and the fourth comb-shaped electrode 108*b*. The second capacitor structure may be similar to the first capacitor structure with reference to FIG. 2, and will not be repeated.

As further illustrated in FIG. 1, the semiconductor device 100 includes a bottom electrode 112, an insulator layer 114, and a top electrode 116, in accordance with some embodiments. The bottom electrode 112, the insulator layer 114, and the top electrode 116, may also be collectively referred to as a third capacitor structure.

The semiconductor device 100 may further include a plurality of conductive vias 110, which may electrically couple the third comb-shaped electrode 108*a* and the fourth comb-shaped electrode 108*b* to the bottom electrode 112. The conductive vias 110 may be similar to the conductive vias 106, and will not be repeated.

Since the first capacitor structure (including the first comb-shaped electrode 104*a* and the second comb-shaped electrode 104*b*), the second capacitor structure (including the third comb-shaped electrode 108*a* and the fourth comb-shaped electrode 108*b*), and the third capacitor structure are stacked vertically, the capacitance of the semiconductor device 100 can be increased without additional design area.

The bottom electrode 112 and the top electrode 116 may each independently formed of the same or different conductive material, including copper, aluminum, titanium, tantalum, polysilicon, the like, or a combination thereof. The insulator layer 114 may be formed of high-k dielectric materials, including $Al_2O_3$, $Ta_2O_5$, $ZrO_2$, $HfO_2$, $TiO_2$, $Si_3N_4$, the like, or a combination thereof.

As shown in FIG. 1, the bottom electrode 112 includes a first portion 112*a*, a second portion 112*b*, and a third portion 112*c*, which are spaced apart by the dielectric material 122. The third comb-shaped electrode 108*a* and the fourth comb-shaped electrode 108*b* may be electrically coupled to the first portion 112*a* and the third portion 112*c* of the bottom electrode 112, respectively. Therefore, the reliability can be enhanced.

As illustrated in FIG. 1, the semiconductor device 100 includes a plurality of conductive vias 118 disposed over the third capacitor structure, in accordance with some embodiments. The conductive vias 118 may be formed of conductive material, including copper, aluminum, titanium, tantalum, polysilicon, the like, or a combination thereof. The conductive vias 118 may include conductive vias 118*a* over the first portion 112*a* of the bottom electrode 112, conductive vias 118*b* over the top electrode 116, and conductive vias 118*c* over the third portion 112*c* of the bottom electrode 112. The configuration and number of the conductive vias 118 shown in the figures are exemplary only and are not intended to limit the present disclosure.

As illustrated in FIG. 1, the semiconductor device 100 includes a conductive layer 120 electrically coupled to the third capacitor structure through the conductive vias 118, in accordance with some embodiments. The conductive layer 120 may be formed of conductive material, including copper, aluminum, titanium, tantalum, polysilicon, the like, or a combination thereof.

The conductive layer 120 may include a first portion 120*a* extending above the first portion 112*a* of the bottom electrode 112 and the top electrode 116. The first portion 120*a* may be electrically coupled to the conductive vias 118*a* and the conductive vias 118*b*. The conductive layer 120 may also include a second portion 120*b* extending above the top electrode 116 and the third portion 112*c* of the bottom electrode 112. The second portion 120*b* may be electrically coupled to the conductive vias 118*b* and the conductive vias 118*c*.

Figure 3:
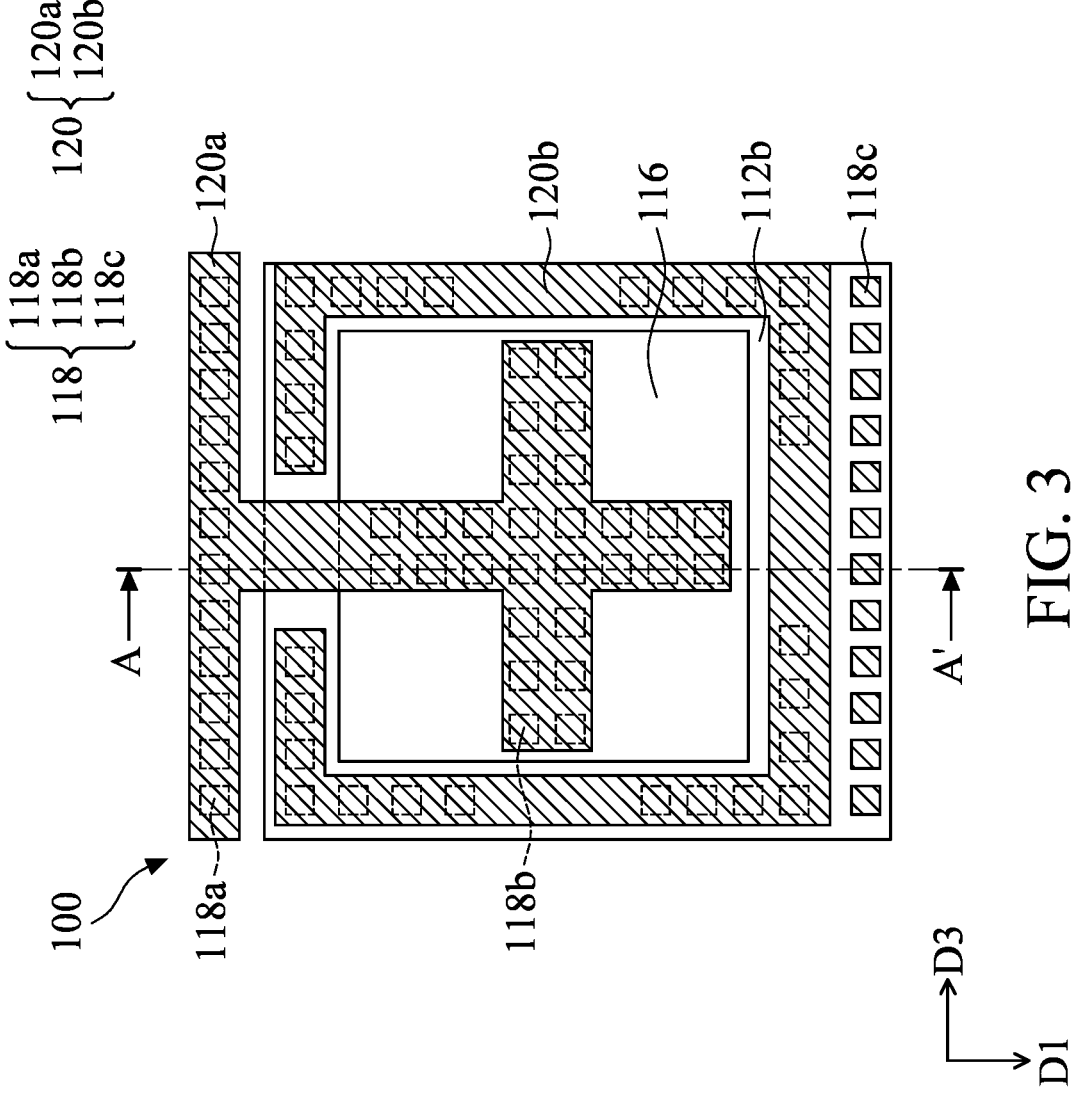
FIG. 3 is a top view of a portion of the exemplary semiconductor device of FIG. 1 in accordance with some embodiments.

FIG. 3 is a top view of a portion of the semiconductor device 100 of FIG. 1, in accordance with some embodiments. FIG. 1 is a cross-sectional view of the semiconductor device 100 taken along line A-A' shown in FIG. 3.

As shown in FIG. 3, the first portion 120*a* of the conductive layer 120 may extend in the direction D3 for electrically coupling the conductive vias 118*a*, and may extend in the direction D1 for electrically coupling the conductive vias 118*a* to the conductive vias 118*b*.

Viewed from above, the second portion 120*c* of the conductive layer 120 may surround the top electrode 116 outside the top electrode 116 for electrically coupling the conductive vias 118. In particular, the second portion 120*c* of the conductive layer 120 may not overlap the top electrode 116 in the direction which is substantially vertical to the top surface of the top electrode 116.

Figure 4:
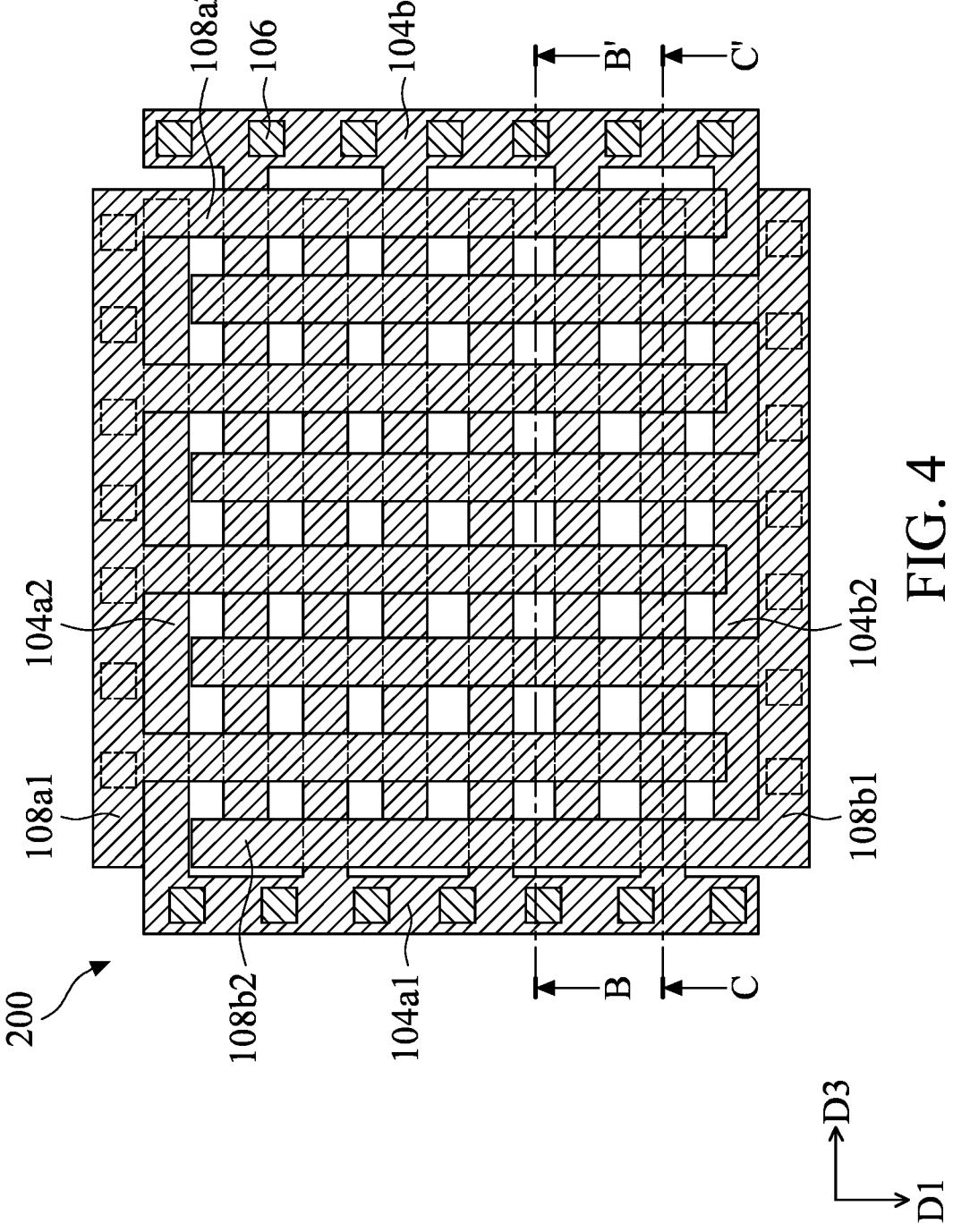
FIG. 4 is a top view of a portion of an exemplary semiconductor device in accordance with some embodiments.

FIG. 4 is a cross-sectional view of a semiconductor device 200, in accordance with some embodiments of the disclosure. It should be noted that the semiconductor device 200 may include the same or similar components as that of the semiconductor device 100, which is illustrated in FIG. 1, and for the sake of simplicity, those components will not be discussed in detail again. In the following embodiments, the relative position of the first capacitor structure and the second capacitor structure is changed.

As shown in FIG. 4, the third comb-shaped electrode 108*a* has a third pad 108*a*1 and a plurality of third fingers 108*a*2 connecting to the third pad 108*a*1, and the fourth comb-shaped electrode 108*b* has a fourth pad 108*b*1 and a plurality of fourth fingers 108*b*2 connecting to the fourth pad 108*b*1, in accordance with some embodiments.

Similar to the semiconductor device 100 in FIG. 1, the first pad 104*a*1 and the second pad 104*b*1 of the first capacitor structure may extend in the direction D1, and the first fingers 104*a*2 and the second fingers 104*b*2 of the first capacitor structure may extend in the direction D3. As shown in FIG. 4, the third pad 108*a*1 and the fourth pad 108*b*1 of the second capacitor structure may extend in the direction D3, and the third fingers 108*a*2 and the fourth fingers 108*b*2 of the second capacitor structure may each extend in the direction D1. Viewed from above, the pads and fingers of the second capacitor structure intersect (or cross) the pads and fingers of the first capacitor structure, thereby further increasing the capacitance.

It should be noted that the positions of the first capacitor structure and the second capacitor structure are shifted for illustrative purposes. The first capacitor structure may overlap the second capacitor structure for electrically coupling. For example, the third fingers 108*a*2 and the fourth fingers 108*b*2 of the second capacitor structure may be disposed directly above the second pad 104*b*1 and the first pad 104*a*1 of the first capacitor structure, respectively. For another example, the third pad 108*a*1 and the fourth pad 108*b*1 of the second capacitor structure may be disposed directly above the second fingers 104*b*2 and the first fingers 104*a*2 of the first capacitor structure, respectively.

Figure 5A:
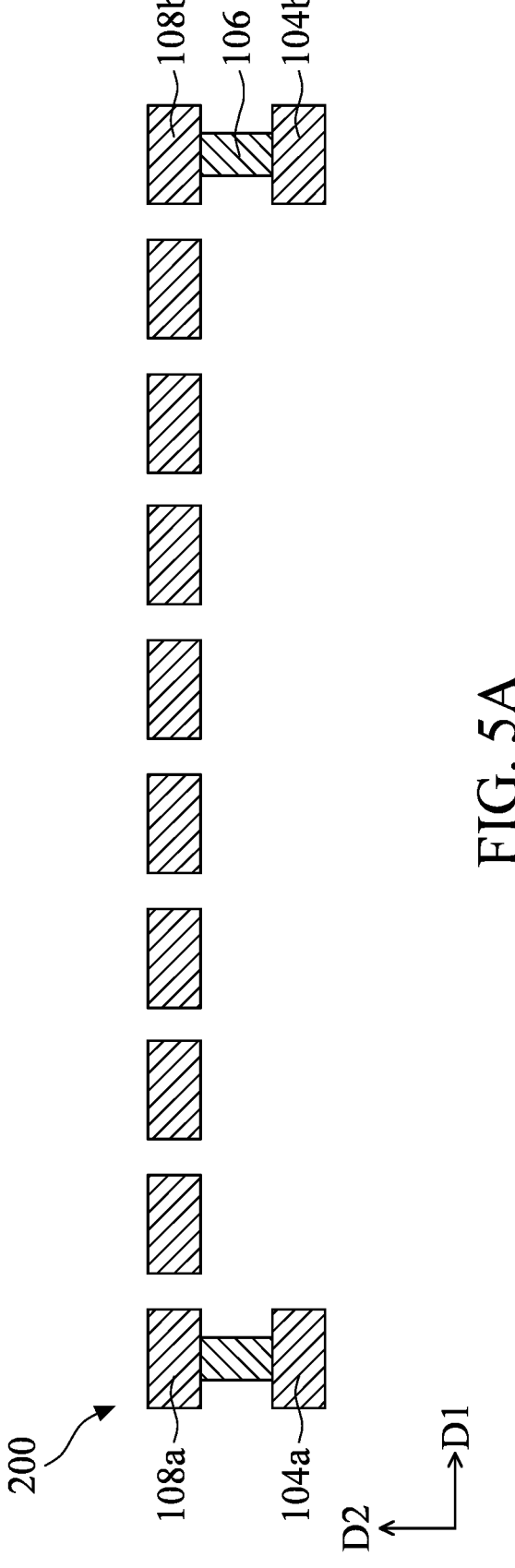
FIG. 5A is a cross-sectional view of a portion of the exemplary semiconductor device of FIG. 4 in accordance with some embodiments.

FIG. 5A is a cross-sectional view of a portion of the semiconductor device 200 taken along line B-B' shown in FIG. 4, in accordance with some embodiments. As shown in FIG. 5, the first comb-shaped electrode 104*a* and the second comb-shaped electrode 104*b* may be disposed directly below the third comb-shaped electrode 108*a* and the fourth comb-shaped electrode 108*b*, respectively. The first comb-shaped electrode 104*a* and the second comb-shaped electrode 104*b* may be adjacent to opposite sidewalls of the second capacitor structure.

Figure 5B:
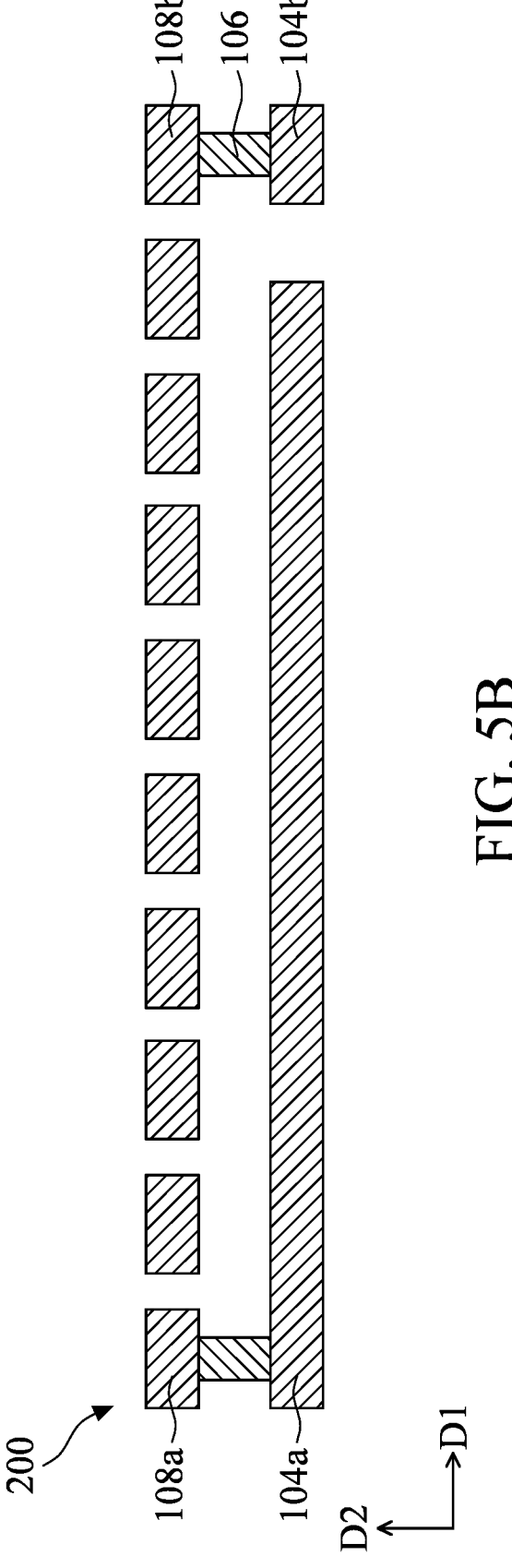
FIG. 5B is a cross-sectional view of a portion of the exemplary semiconductor device of FIG. 4 in accordance with some embodiments.

FIG. 5B is a cross-sectional view of a portion of the semiconductor device 200 taken along line C-C' shown in FIG. 4, in accordance with some embodiments. As shown in FIG. 5, the second comb-shaped electrode 104*b* may be disposed directly below the fourth comb-shaped electrode 108*b*, and the first comb-shaped electrode 104*a* may extend below alternative the third comb-shaped electrode 108*a* and the fourth comb-shaped electrode 108*b*.

Figure 6:
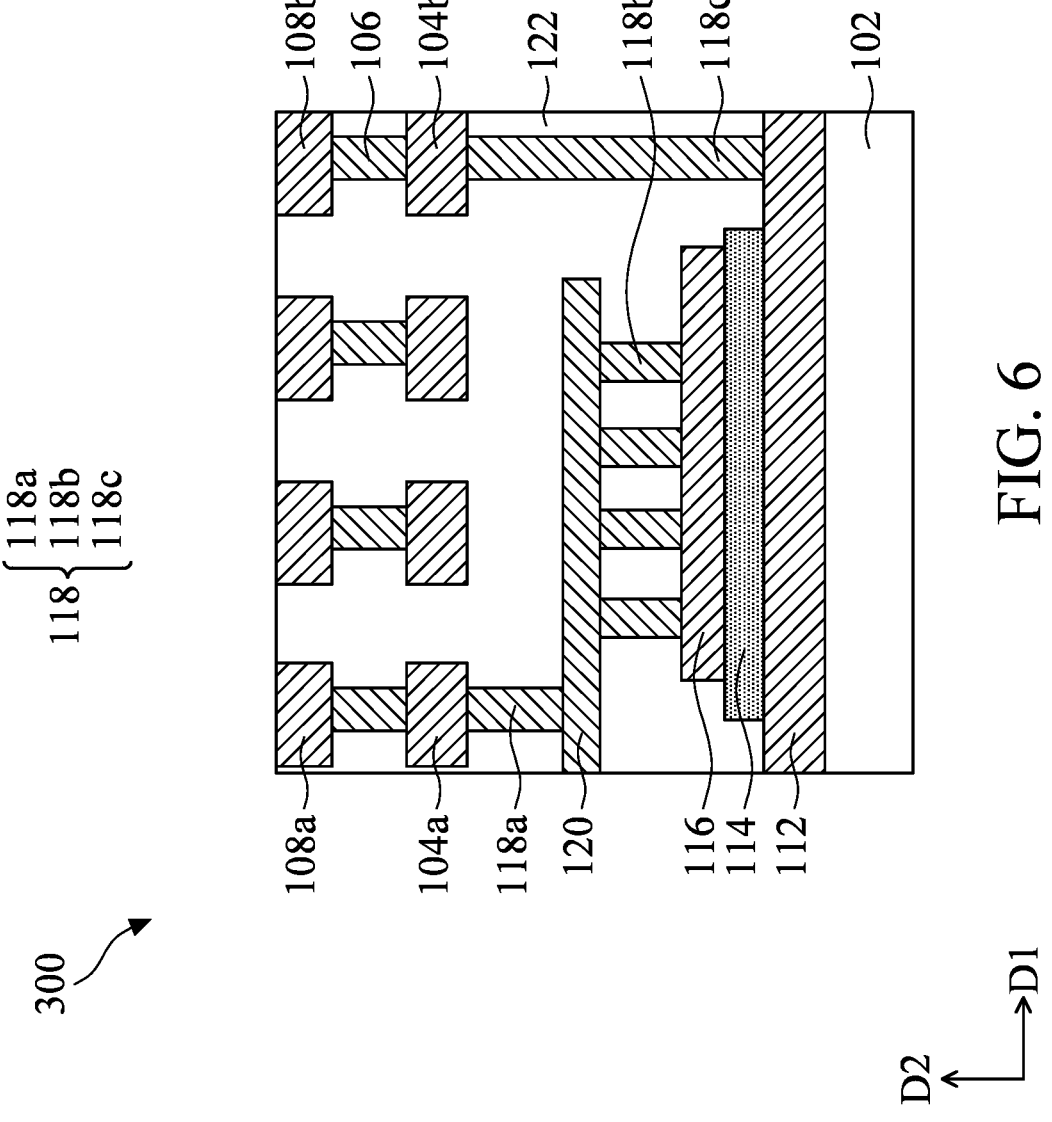
FIG. 6 is a cross-sectional view of an exemplary semiconductor device in accordance with some embodiments.

FIG. 6 is a cross-sectional view of a semiconductor device 300, in accordance with some embodiments of the disclosure. It should be noted that the semiconductor device 300 may include the same or similar components as that of the semiconductor device 100, which is illustrated in FIG. 1, and for the sake of simplicity, those components will not be discussed in detail again. In the following embodiments, the comb-shaped electrodes are disposed over the top electrode.

As shown in FIG. 6, the first comb-shaped electrode 104*a* and the second comb-shaped electrode 104*b* are disposed over the conductive layer 120, in accordance with some embodiments. The first comb-shaped electrode 104*a* and the second comb-shaped electrode 104*b* may be electrically coupled to the top electrode 116 and the bottom electrode 112, respectively.

As illustrated in FIG. 6, the conductive vias 118*a* may be disposed between the first comb-shaped electrode 104*a* and the conductive layer 120, and the first comb-shaped electrode 104*a* may be electrically coupled to the top electrode 116 through the conductive vias 118*a*, 118*b*, and the conductive layer 120. As further illustrated in FIG. 6, the second comb-shaped electrode 104*b* may be electrically coupled to the bottom electrode 112 through the conductive vias 118*c*.

As shown in FIG. 6, the third comb-shaped electrode 108*a* and the fourth comb-shaped electrode 108*b* are disposed over the first comb-shaped electrode 104*a* and the second comb-shaped electrode 104*b*, and the conductive vias 106 are disposed therebetween, in accordance with some embodiments.

According to some embodiments, the positions of the third comb-shaped electrode 108*a* and the fourth comb-shaped electrode 108*b* may correspond to the positions of the first comb-shaped electrode 104*a* and the second comb-shaped electrode 104*b*, as illustrated in FIG. 6. According to some other embodiments, the third comb-shaped electrode 108*a* and the fourth comb-shaped electrode 108*b* may intersect (or cross) the first comb-shaped electrode 104*a* and the second comb-shaped electrode 104*b* when viewed from above, as described above with reference to FIG. 4.

Figure 7:
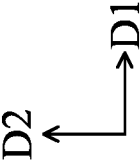
FIG. 7 is a cross-sectional view of an exemplary semiconductor device in accordance with some embodiments.

FIG. 7 is a cross-sectional view of a semiconductor device 400, in accordance with some embodiments of the disclosure. It should be noted that the semiconductor device 400 may include the same or similar components as that of the semiconductor device 100, which is illustrated in FIG. 1, and for the sake of simplicity, those components will not be discussed in detail again. In the following embodiments, the semiconductor device 400 includes additional comb-shaped electrodes.

As shown in FIG. 7, the semiconductor device 400 includes a fifth comb-shaped electrode 124*a* and a sixth comb-shaped electrode 124*b* disposed over the conductive layer 120, in accordance with some embodiments. The fifth comb-shaped electrode 124*a* and the sixth comb-shaped electrode 124*b* may be electrically coupled to the first portion 120*a* and the second portion 120*b* of the conductive layer 120, respectively. The semiconductor device 400 may further include conductive vias 118*d* and 118*e* therebetween.

In some embodiments, a fourth capacitor structure includes the fifth comb-shaped electrode 124*a* and the sixth comb-shaped electrode 124*b*. The fourth capacitor structure may be similar to the first capacitor structure with reference to FIG. 2, the conductive vias 118*d* and 118*e* may be similar to the conductive vias 118*a*, 118*b* and 118*c*, and will not be repeated.

As illustrated in FIG. 7, the semiconductor device 400 includes a seventh comb-shaped electrode 128*a* and an eighth comb-shaped electrode 128*b* disposed over the fifth comb-shaped electrode 124*a* and the sixth comb-shaped electrode 124*b*, in accordance with some embodiments. The seventh comb-shaped electrode 128*a* and the eighth comb-shaped electrode 128*b* may be electrically coupled to the seventh comb-shaped electrode 128*a* and the eighth comb-shaped electrode 128*b*, respectively, through a plurality of conductive vias 126.

In some embodiments, a fifth capacitor structure includes the seventh comb-shaped electrode 128*a* and the eighth comb-shaped electrode 128*b*. The fifth capacitor structure may be similar to the first capacitor structure with reference to FIG. 2, the conductive vias 126 may be similar to the conductive vias 106, and will not be repeated. With the growing number of capacitor structures, the capacitance of the semiconductor device 400 can be increased.

According to some embodiments, the positions of the seventh comb-shaped electrode 128*a* and the eighth comb-shaped electrode 128*b* may correspond to the positions of the fifth comb-shaped electrode 124*a* and the sixth comb-shaped electrode 124*b*, as illustrated in FIG. 7. According to some other embodiments, the seventh comb-shaped electrode 128*a* and the eighth comb-shaped electrode 128*b* may intersect (or cross) the fifth comb-shaped electrode 124*a* and the sixth comb-shaped electrode 124*b* when viewed from above, as described above with reference to FIG. 4.

It should be noted that the configuration and number of the comb-shaped electrodes shown in the figures are exemplary only and are not intended to limit the present disclosure. For example, the semiconductor device may include one comb-shaped electrode over the top electrode 116 and three comb-shaped electrodes below the top electrode 116, and the three comb-shaped electrodes may include corresponding positions or may intersect (or cross) one another when viewed from above.

In summary, the semiconductor device according to the present disclosure includes capacitor structures which are stacked vertically. Therefore, the capacitance can be increased. In some embodiments, the capacitor structures intersect (or cross) one another when viewed from above to further increase capacitance. Additionally, in some embodiments, the bottom electrode includes separate portions which are electrically coupled to different components to enhance the reliability.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A capacitor structure, comprising:
a first comb-shaped electrode having a first pad and a plurality of first fingers connecting to the first pad;
a second comb-shaped electrode having a second pad and a plurality of second fingers connecting to the second pad, wherein one of the second fingers is disposed between two adjacent first fingers;

a bottom electrode formed in a metal layer, the bottom electrode comprising a first portion, a second portion and a third portion which are separate portions and are spaced apart by a dielectric material, wherein the second potion is disposed between the first portion and the third portion, and wherein each of the first portion, the second portion, and the third portion is electrically isolated from one another through the dielectric material within the metal layer, and the first portion and the third portion are electrically coupled to the first comb-shaped electrode and the second comb-shaped electrode, respectively;

an insulator layer disposed over the bottom electrode; and a top electrode disposed over the insulator layer.

2. The capacitor structure as claimed in claim 1, wherein the first comb-shaped electrode is spaced apart from the second comb-shaped electrode by the dielectric material.

3. The capacitor structure as claimed in claim 1, further comprising:

a third comb-shaped electrode disposed below the first comb-shaped electrode and having a third pad and a plurality of third fingers connecting to the third pad; and a fourth comb-shaped electrode disposed below the first comb-shaped electrode and having a fourth pad and a plurality of fourth fingers connecting to the fourth pad, wherein one of the fourth fingers is disposed between two adjacent third fingers.

4. The capacitor structure as claimed in claim 3, wherein the third pad is substantially parallel to the first pad, and the fourth pad is substantially parallel to the second pad.

5. The capacitor structure as claimed in claim 3, wherein the third pad is substantially parallel to the plurality of first fingers, and the fourth pad is substantially parallel to the plurality of second fingers.

6. The capacitor structure as claimed in claim 1, further comprising:

a third comb-shaped electrode disposed over the top electrode and having a third pad and a plurality of third fingers connecting to the third pad; and a fourth comb-shaped electrode disposed over the top electrode and having a fourth pad and a plurality of fourth fingers connecting to the fourth pad, wherein one of the fourth fingers is disposed between two adjacent third fingers.

7. The capacitor structure as claimed in claim 6, wherein the first portion and the third portion of the bottom electrode are electrically coupled to the third comb-shaped electrode and the fourth comb-shaped electrode, respectively.

8. The capacitor structure as claimed in claim 6, further comprising:

a fifth comb-shaped electrode disposed over the third comb-shaped electrode and having a fifth pad and a plurality of fifth fingers connecting to the fifth pad; and a sixth comb-shaped electrode disposed over the third comb-shaped electrode and having a sixth pad and a plurality of sixth fingers connecting to the sixth pad, wherein one of the sixth fingers is disposed between two adjacent fifth fingers.

9. The capacitor structure as claimed in claim 8, wherein the fifth pad is substantially parallel to the third pad, and the sixth pad is substantially parallel to the fourth pad.

10. The capacitor structure as claimed in claim 8, wherein the fifth pad is substantially parallel to the plurality of third fingers, and the sixth pad is substantially parallel to the plurality of fourth fingers.

11. A semiconductor device, comprising:

a first capacitor structure disposed over a substrate and comprising:

a first comb-shaped electrode; and a second comb-shaped electrode adjacent to the first comb-shaped electrode;

a dielectric material disposed over the first capacitor structure; and a second capacitor structure disposed over the dielectric material and comprising:

a bottom electrode formed in a metal layer, the bottom electrode comprising a first portion, a second portion, and a third portion which are separate portions and are spaced apart by the dielectric material, wherein the second potion is disposed between the first portion and the third portion, and wherein each of the first portion, the second portion, and the third portion is electrically isolated from one another through the dielectric material within the metal layer, and the first portion and the third portion are electrically coupled to the first capacitor structure;

an insulator layer disposed over the bottom electrode; and a top electrode disposed over the insulator layer.

12. The semiconductor device as claimed in claim 11, wherein the dielectric material extends between the first comb-shaped electrode and the second comb-shaped electrode.

13. The semiconductor device as claimed in claim 11, further comprising a third capacitor structure disposed between the substrate and the first capacitor structure and comprising:

a third comb-shaped electrode; and a fourth comb-shaped electrode adjacent to the third comb-shaped electrode and spaced apart from the third comb-shaped electrode by the dielectric material.

14. The semiconductor device as claimed in claim 11, further comprising a third capacitor structure disposed over the second capacitor structure and comprising:

a third comb-shaped electrode; and a fourth comb-shaped electrode adjacent to the third comb-shaped electrode and spaced apart from the third comb-shaped electrode by the dielectric material.

15. The semiconductor device as claimed in claim 14, further comprising a fourth capacitor structure electrically coupled to the third capacitor structure and comprising:

a fifth comb-shaped electrode; and a sixth comb-shaped electrode adjacent to the fifth comb-shaped electrode and spaced apart from the fifth comb-shaped electrode by the dielectric material.

16. The semiconductor device as claimed in claim 14, further comprising a conductive layer disposed between the second capacitor structure and the third capacitor structure.

* * * * *